(12) United States Patent
Umanskiy et al.

(10) Patent No.: US 6,556,028 B1
(45) Date of Patent: Apr. 29, 2003

(54) METHOD AND APPARATUS FOR DETECTING DEFECTS IN PIEZOELECTRIC ACTUATORS

(75) Inventors: Yuriy Umanskiy, Aurora, CO (US); Arnold Shpilberg, Palo Alto, CA (US); Vladimir Vaninskiy, Aurora, CO (US); Eugene Dvoskin, Aurora, CO (US)

(73) Assignee: Storage Test Solutions, Inc., Aurora, CO (US)

( * ) Notice: Subject to any disclaimer, the term of this patent is extended or adjusted under 35 U.S.C. 154(b) by 0 days.

(21) Appl. No.: 09/850,049

(22) Filed: May 7, 2001

(51) Int. Cl.[7] ............................................. G01R 29/22
(52) U.S. Cl. ...................................................... 324/727
(58) Field of Search ................................. 324/617, 618, 324/619, 727; 73/579, 587, 599; 360/75, 294.4

(56) References Cited

U.S. PATENT DOCUMENTS

| | | | |
|---|---|---|---|
| 3,786,348 A | * 1/1974 | Lynas et al. | 324/56 |
| 3,882,388 A | * 5/1975 | Nery | 324/133 |
| 4,151,569 A | * 4/1979 | Hathaway | 360/77 |
| 4,188,645 A | 2/1980 | Ragle et al. | 360/75 |
| 4,494,408 A | 1/1985 | DeLacy | 73/587 |
| 5,189,578 A | 2/1993 | Mori et al. | 360/294.6 |
| 5,301,558 A | 4/1994 | Livingston et al. | 731/862.541 |
| 5,447,051 A | * 9/1995 | Hanks et al. | 73/1 D |
| 5,728,937 A | 3/1998 | Reichau et al. | 73/579 |
| 6,111,335 A | * 8/2000 | Acatrinei | 310/316.03 |
| 6,308,554 B1 | * 10/2001 | Mattes et al. | 73/1.37 |

OTHER PUBLICATIONS

Wei Guo et al., "A High Bandwidth Piezoelectric Suspension For High Track Density Magnetic Data Storage Devices," IEEE Transactions on Magnetics, vol. 34, No. 4, Jul. 1998, pp. 1907–1909.

* cited by examiner

*Primary Examiner*—Safet Metjahic
*Assistant Examiner*—Etienne P LeRoux
(74) *Attorney, Agent, or Firm*—Warren S. Wolfeld; Haynes Beffel & Wolfeld LLP

(57) ABSTRACT

Roughly described, piezoelectric actuators are tested as part of an assembly using a three-stage process. In the first stage, a substantially steady state electromechanical potential is induced into a piezoelectric member of an assembly. Typically this can be accomplished by applying a DC voltage across the crystal for long enough period of time for it to achieve a substantially steady state mechanical distortion. In the second stage, the electromechanical potential of the piezoelectric actuator is discharged rapidly but incompletely. The third stage begins with the abrupt termination of the rapid-discharge stage, thereby causing the crystal, and the voltage produced across it, to oscillate and decay freely. The voltage across the crystal continues to decay slowly in the third stage, and the oscillations continue to decay in magnitude as well, providing a relatively complex signal from which features can be extracted and compared to those of known-good devices.

56 Claims, 5 Drawing Sheets

METHOD AND APPARATUS FOR DETECTING DEFECTS IN PIEZOELECTRIC ACTUATORS

BACKGROUND

1. Field of the Invention

The invention relates to methods and apparatus for testing piezoelectric actuators, particularly but not exclusively for piezoelectric actuators in magnetic heads-arm assemblies.

2. Description of Related Art

Piezoelectric actuators offer the user several advantages over other motion techniques. These include sub-nanometer displacement steps and high frequencies, very low power consumption in static operation, high reliability, and long life. Piezoelectric actuators achieve these characteristics because their motion is based on molecular effects within solid-state crystals.

Piezoelectric actuators rely on the piezoelectric effect, which has two versions. The "direct" piezoelectric effect is the appearance of an electrical potential across certain faces of a crystal when it is subjected to mechanical pressure or distortion. The "inverse" piezoelectric effect, is just the opposite: the crystal mechanically distorts in response to the application of an electric potential across certain faces of the crystal. In practical application, the "direct" and "inverse" piezoelectric effects interact with each other to yield complex motion and complex potential in response to transient excitation.

Because of their advantages, piezoelectric actuators are coming into widespread use in various industrial applications. In one particular use, manufacturers of disk head-arm assemblies are achieving extremely fine displacement resolutions by including piezoelectric actuators in the head-arm assemblies. Examples of such assemblies are shown in the following documents, all incorporated by reference herein:

U.S. Pat. No. 4,188,645

U.S. Pat. No. 5,189,578

Guo et al., "A High Bandwidth Piezoelectric Suspension for High Track Density Magnetic Data Storage Devices," IEEE Transactions on Magnetics, Volume 34, No.4, pp. 1907–1909 (July 1988)

Fan et al., "Magnetic Recording Head Positioning at Very High Track Densities Using a Microactuator-Based Two-Stage Servo System," IEEE Trans. on Ind. Elect., Vol.42, No. 3, pp. 222–233 (June 1995)

Miu, "Silicon Micro-actuators for Rigid Disk Drives," Data Storage, pp. 3340 (July/August 1995)

Takaishi, et al., "Micro-actuator Control for Disk Drive," IEEE Trans. on Mag., Vol. 32, No. 3, pp. 1863–1866 (May 1996)

Koganezawa, et al., "A Flexural Piggyback Milli-Actuator for Over 5 Gbit/in.$^2$ Density Magnetic Recording," IEEE Trans. on Mag., Vol 32, No. 5, pp. 3908–3910 (September 1996)

Mori, et al., "A Dual-Stage Magnetic Disk Drive Actuator Using a Piezoelectric Device for a High Track Density," IEEE Trans. on Mag., Vol. 27, No. 6, pp. 5289–5230 (November 1991).

It can be seen that piezoelectric actuators can be used in head-arm assemblies in a wide variety of different structural formats. These include, but not limited to, structures using a single actuator and structures using two or more actuators; structures taking advantage of the linear expansion and contraction of the piezoelectric actuator directly and those which make use of the piezoelectric element only as part of bi-part strips; structures in which energization of the actuator(s) causes the head-arm effectively to lengthen or contract in the radial direction of the disk, and those which cause the head to move in the lateral direction substantially transverse to the radial direction of the disk. Many other structural formats incorporating piezoelectric actuators will be apparent.

FIGS. 1 and 2 also show an example of a head-arm assembly incorporating a piezoelectric actuator. FIG. 1 illustrates a Head Stack Array (HSA) 100 which includes five head-arm assemblies 110. FIG. 2 is a close-up view of one of the head-arm assemblies 110. It includes a flexure 112 extending outward from the end of an arm 114 of the HSA, and attached thereto by a beam 116. The beam flexes horizontally, thereby allowing the head 118 at the end of the flexure 112 to move slightly in either the left or right direction as indicated by the arrow 120. The left and right sides of the arm 112 are separated from the end of the arm 114 by respective piezoelectric crystals 122 and 124. The piezoelectric crystals 122 and 124 have electric field plates formed on opposing faces thereof. A control lead 126 is connected to one plate of crystal 122, and a second control lead 128 is connected to one plate of crystal 124. The second plates of crystals 122 and 124 are connected together and to a common third control lead 130. The crystals are driven differentially by a voltage source 132 in the body of the disk drive. It can be seen that as the voltage source goes positive, one of the piezoelectric crystals 122 and 124 will lengthen slightly and the other will shrink slightly, thereby causing a slight horizontal displacement of the head at the end of the head-arm 112. If the voltage source 132 goes negative, then the head will move slightly in the opposite horizontal direction. In one embodiment, the piezoelectric crystals on all the head-arms 110 on HSA 100 are connected together in parallel, such that all of the head-arms 110 move to the left or right in common. In other embodiment, each of the head-arm assemblies are operated independently from the others. Many other mechanisms for incorporating piezoelectric actuators into head-arm assemblies and HSAs are possible.

Disk drive component manufacturers typically test the various components of the disk drive before they are incorporated into assemblies or sub-assemblies. The piezoelectric crystals are among the many aspects of a head-arm assembly or HSA that must be tested. Several methods are known for testing piezoelectric actuators, though not specifically for magnetic disk head-arm assemblies. For example, Livingston U.S. Pat. No. 5,301,558, incorporated herein by reference, describes one such technique in which the piezoelectric crystal is placed in a testing apparatus which applies axial forced to the actuator. A fiber optics sensor determines the axial displacement of the actuator. A computer then uses this information to determine the effective modulus of the actuator. Aside from not being able to test parameters of an actuator desired for application in magnetic disk head-arm assemblies, the basic approach of this patent has an important disadvantage: the testing device tests the actuator itself, and not the assembly containing the actuator. This means that the actuator must be handled after testing and before being incorporated into the assembly, and this handling itself poses a risk of damage. It also means that the test cannot be used to detect damage or errors in the way that the actuator is eventually incorporated into the assembly. On the other hand, is often extremely difficult to develop tests of piezoelectric actuators which have been incorporated into assemblies, because the possibility for mechanical or even optical contact is very limited.

Lynas U.S. Pat. No. 3,786,348, incorporated by reference herein, describes a non-contact method for remotely indicating whether a piezoelectric transducer is properly connected in a circuit. Roughly described, and as understood, the method involves applying voltage impulses across the transducer and detecting the voltages produced by the transducer in response thereto. Impulse methods are disadvantageous, however, because they typically cannot apply sufficient energy to produce a meaningful result. Excitation energy levels can be increased by increasing the amplitude of the impulses, but such large amplitudes can sometimes risk destroying the piezoelectric device under test.

Other known methods for nondestructive testing of materials might also be usable for testing piezoelectric actuators in situ. Such known methods include continuous sine wave excitation within some frequency range, for example, but this technique typically requires a very large testing time because the tester must typically sweep the testing frequency through some range, performing tests at each of a number of discrete frequencies within that range.

Accordingly, there is a need for a method and apparatus for testing piezoelectric actuators in situ, which does not require physical or optical contact and with the actuators, does not involve high voltage impulse excitation, and does not require the lengthy testing time periods involved with sine wave excitation methods.

SUMMARY THE INVENTION

According to the invention, roughly described, piezoelectric actuators are tested as part of an assembly using a three-stage process. In the first stage, a steady-state electromechanical potential is induced into a piezoelectric member of an assembly. Typically this can be accomplished by applying a DC voltage across the crystal for long enough period of time for it to achieve (among other effects) a steady-state, or substantially steady-state, mechanical distortion. In the second stage, the electromechanical potential of the piezoelectric actuator is discharged rapidly but incompletely. The third stage begins with the abrupt termination of the rapid-discharge stage, thereby causing the crystal, and the voltage produced across it, to oscillate and decay freely. The voltage across the crystal continues to decay slowly in the third stage, and the oscillations continue to decay in magnitude as well, providing a relatively complex signal from which features can be extracted and compared to those of known-good devices. In an aspect of the invention, calibration of the testing system is avoided by extracting both time and frequency domain parameters from the Stage 3 output signal and comparing these to corresponding parameters of known-good devices.

BRIEF DESCRIPTION OF THE DRAWINGS

The invention will be described with respect to particular embodiments thereof, and reference will be made to the drawings, in which.

DETAILED DESCRIPTION

Figure 1:
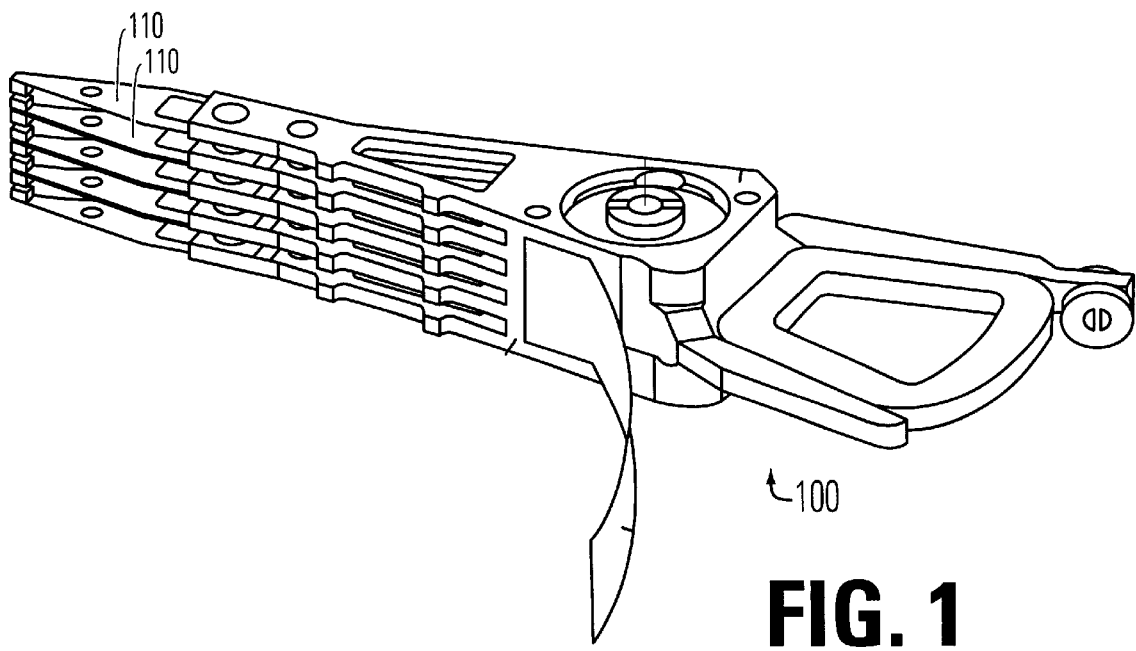
FIG. 1 is a perspective view of a head stack assembly.
Figure 2:
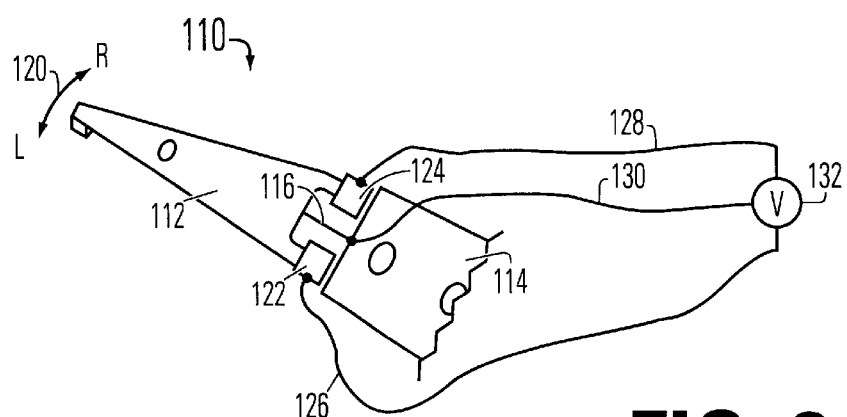
FIG. 2 is a top view of an example head-arm assembly (device under test).
Figure 3:
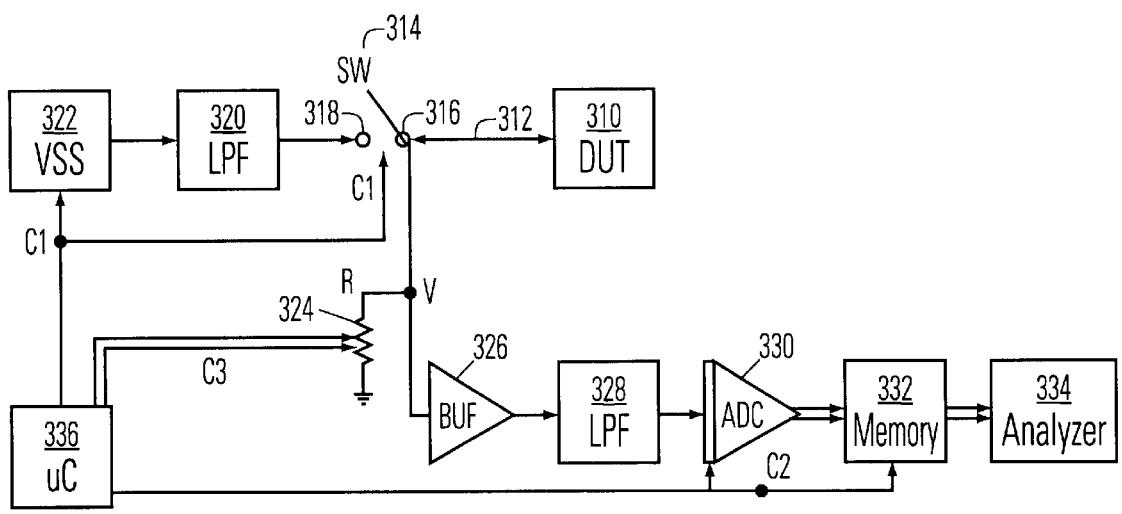
FIG. 3 is a block diagram of testing apparatus for use with a DUT.

FIG. 3 is a block diagram of example testing apparatus according to the invention for use with a device under test (DUT) 310, which may for example be a piezoelectric actuator formed as part of a head-arm assembly or a head stack assembly. The signal input 312 to the DUT is a voltage signal applied to one face of the DUT crystal, the opposite face of which is connected to a fixed DC voltage such as ground. The voltage input 312 to the DUT is connected to one terminal 316 of a switch 314, the other terminal 318 of which is connected to the output of a low pass filter 320. The input of low pass filter 320 is connected to the output of a voltage step source 322. In one embodiment, the VSS 322 is realized using simply a stable DC voltage source and an electronic switch.

The signal input 312 of DUT 310 is also the voltage output node of the DUT. In addition to being connected to the switch 314, it is also connected through a variable resistor 324 to a fixed DC voltage, such as ground. Is also connected to the high impedance input of a buffer 326, the output of which is connected through a low pass filter 328 to the analog input of an analog-to-digital converter (ADC) 330. The digital output of the ADC 330 is recorded in a memory 332 which can be read by an analyzer 334. The analyzer 334 may include, for example, a microcomputer, a DSP chip, and/or a DFT chip.

A microcontroller 336, which may in some embodiments be physically part of the analyzer 334, provides a control signal C1 to the voltage step source 322 and the switch 314. When C1 is asserted (on), the source 322 is active and the switch 314 is closed (conducting). When C1 is negated (off), VSS 322 is off and the switch 314 is open (non-conducting). The microcontroller 336 also provides a control input C3 to the resistor 324. When C3 is asserted (on), the resistor 322 is set to a low resistance value. When C3 is negated (off), the resistor 322 is set to a very high resistance value. It will be appreciated that variable resistor 324 can in some embodiments be replaced by a fixed resistor and a series switch which is controlled by signal C3. The microcontroller 336 also provides a control signal C2 to the ADC 330 and memory 332, to control the sampling of the output signal during Stage 3.

Figure 6:
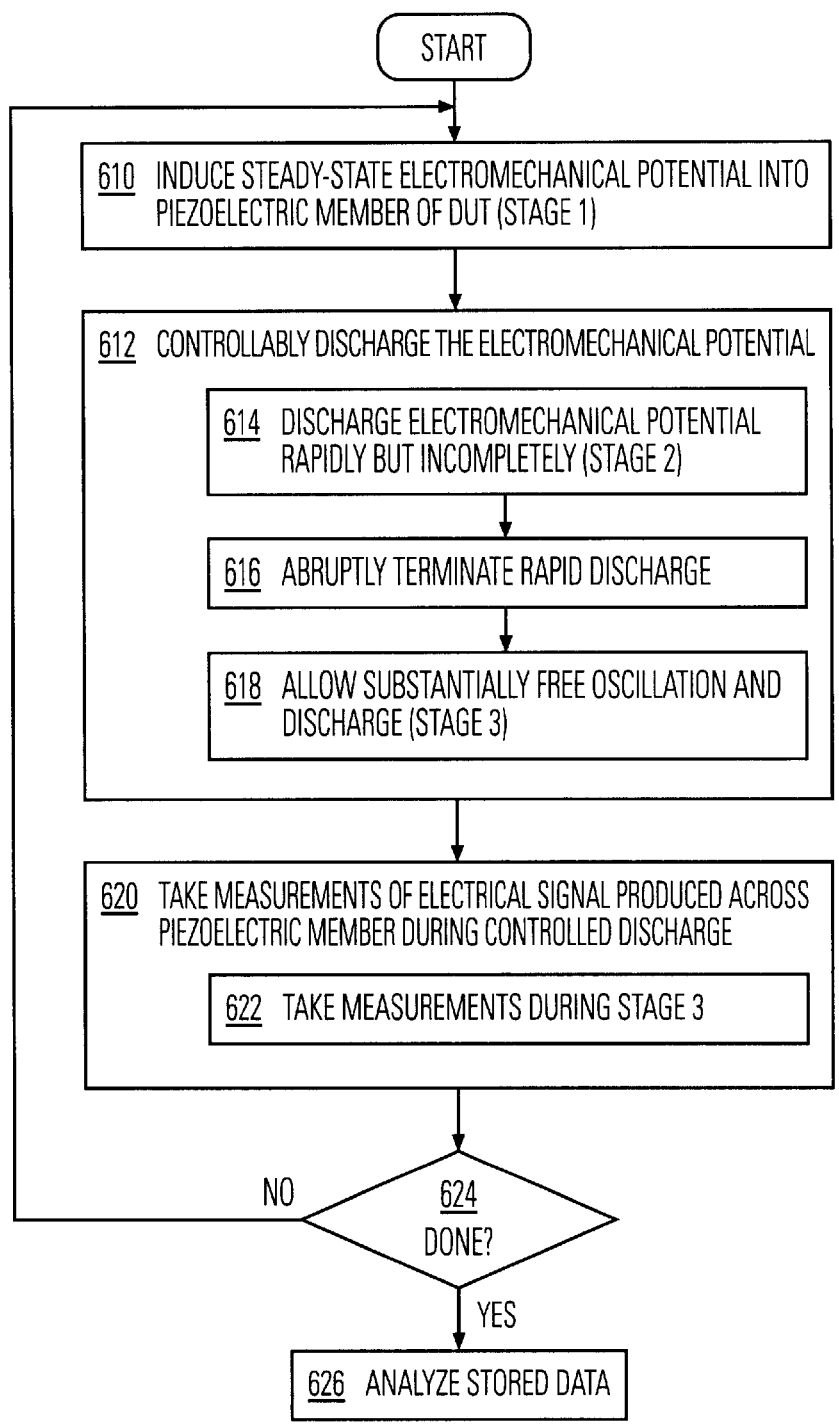
FIG. 6 is a flowchart illustrating an overall algorithm for testing piezoelectric assemblies using the apparatus of FIG. 3.

FIG. 6 is a flowchart illustrating the overall algorithm for testing piezoelectric assemblies using the apparatus of FIG. 3. In step 610, which is also referred to herein as Stage 1, the apparatus induces a steady state electromechanical potential into the piezoelectric member of the DUT. Step 610 is described in more detail hereinafter, but in general, the embodiment of FIG. 3 accomplishes this by applying a steady state voltage to the DUT 310. In other embodiments, it can be accomplished in other ways. As one alternative example, the electromechanical potential can be induced into the piezoelectric member by mechanically moving the assembly so as to compress or expand the piezoelectric member, and holding it until a steady state electromechanical potential is achieved.

In step 612, the apparatus controllably discharges electromechanical potential. Again this step is described in greater detail below, but roughly, in the embodiment of FIG. 3, it is accomplished in three parts. In particular, in step 614, the apparatus discharges the electromechanical potential in the DUT rapidly but incompletely. The period of time during which this is accomplished is sometimes referred to herein as Stage 2. In step 616, the rapid discharge is abruptly terminated, and in step 618, the apparatus allows the piezoelectric member of the DUT to oscillate and discharge substantially freely (i.e. with substantially no further influences external to the DUT). The period of time during which step 618 takes place is sometimes referred to herein as Stage 3. In another embodiment there can be some external influences on the DUT during Stage 3, as long as these are sufficiently understood and accounted for in downstream processing.

During the controlled discharge step 612, the apparatus samples (takes measurements of) the electrical signal produced across the piezoelectric member. As indicated in step 622, in the embodiment of FIG. 3, such measurements are taken only during the substantially free oscillation and discharge step 618 (Stage 3), and not during either Stage 1 or Stage 2.

In step 624, if sufficient numbers of trials have been completed to produce a statistically satisfactory analysis, then control proceeds to step 626 where the data stored in memory 332 is analyzed as described hereinafter. If not, then control returns to step 610 where a new steady state electromechanical potential is introduced into the piezoelectric member of the DUT.

Figure 4:
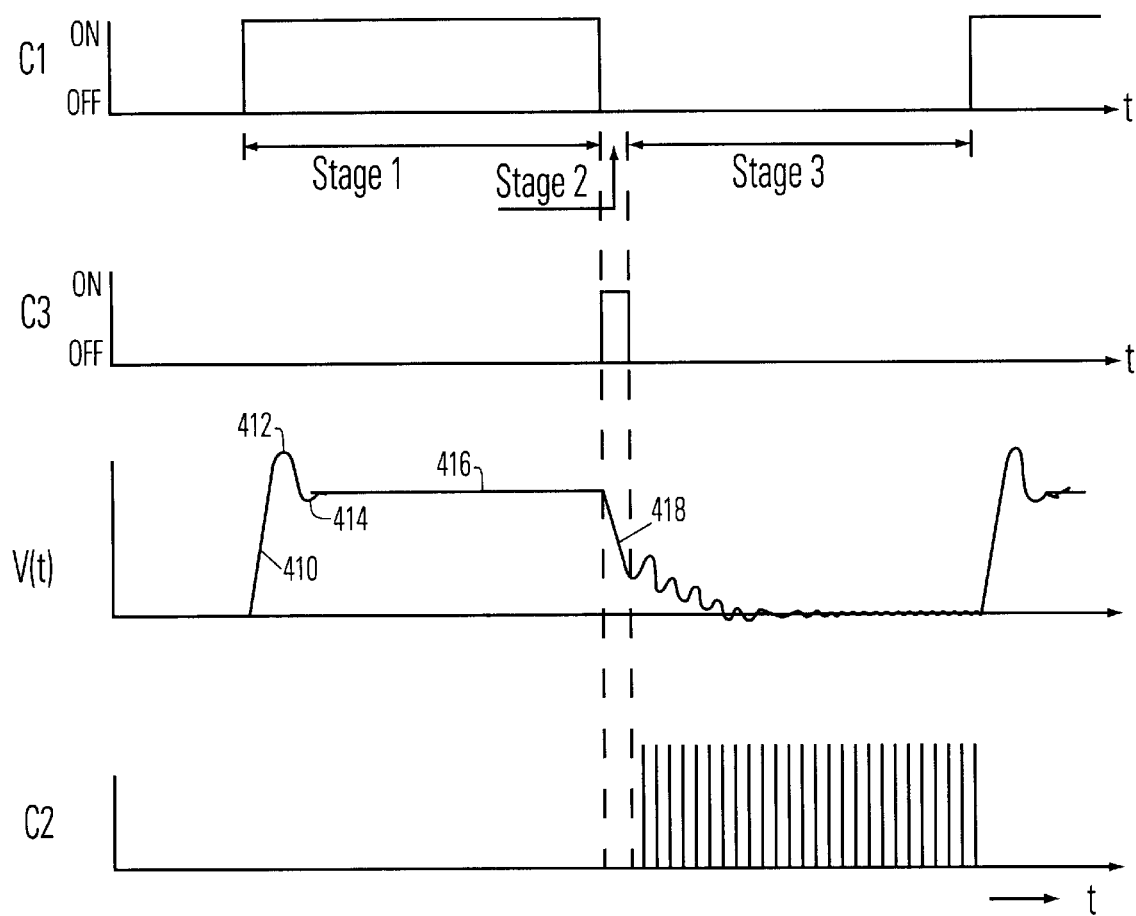
FIG. 4 is a diagram of certain control signals output by the microcontroller of FIG. 3, and the output voltage across the DUT.

FIG. 4 illustrates the state of the various control signals C1, C2 and C3 output by the microcontroller 336 during operation of the apparatus FIG. 3. It also illustrates the voltage output V(t) across the piezoelectric member of the DUT 310. At the beginning of Stage 1, the microcontroller 336 asserts C1 to thereby triggering VSS 322 to rise to a predetermined DC voltage. At the same time, C1 triggers switch 314 to close and thereby connect the output of low pass filter 320 to the DUT 310. It is desirable that the rise of the voltage to the actuator be made as short as possible in order to shorten the testing time, but it is also important that the voltage rise be slow enough to satisfy mechanical limitations on maximum actuator acceleration. The low pass filter 320 helps to shape the excitation voltage of VSS 322 in order to achieve a satisfactory compromise between these two competing goals. During Stage 1, control signal C3 is off, thereby causing resistor 324 to exhibit a very high impedance (or open circuit in the case of a series switch). Thus the voltage V appearing across the piezoelectric crystal in DUT 310 exhibits a relatively fast but not immediately rise 410, followed by a small overshoot 412 and undershoot 414, before it reaches a steady state DC value 416. This is all illustrated in FIG. 4. The piezoelectric crystal accumulates electromechanical potential energy during Stage 1 by mechanically deforming in conformity with the inverse piezoelectric effect. It also accumulates electrical charge across the equivalent capacitance of the crystal. The system maintains the steady state DC value 416 across the piezoelectric crystal for a long enough period of time for the crystal 310 to achieve a steady state electromechanical potential. Note that the electromechanical potential achieved need not be exactly steady state, as long as it is "substantially" so (sufficiently steady in order to achieve a desired level of accuracy in the results).

As can be seen in FIG. 4, at the beginning of Stage 2, the microcontroller 336 turns off C1, thereby disconnecting the voltage node 312 from the voltage step source 322. Left to itself, the voltage across the piezoelectric crystal 310 would at this point begin to decay gradually to zero. The profile of the decay is not purely exponential, however, because it depends upon a complex interaction between both the electrical and mechanical parameters of the crystal. In one embodiment, characteristics of the this free decay profile can be extracted and used to determine whether the crystal is operating properly. One characteristic of a crystal that is extremely useful for determining whether it is operating properly, however, is the resonant frequency that it exhibits. Crystal resonant frequencies that are incorporated into head-arm assemblies are typically on the order of 5–10 kHz, which is much higher than the frequency spectrum of the typical voltage profile of a freely decaying crystal.

Accordingly, as can be seen in FIG. 4, the microcontroller 336 also asserts control signal C3 at the beginning of Stage 2, to thereby switch resistor 324 to a low resistance. As can be seen in region 418 of the V(t) curve in FIG. 4, this draws energy out of the piezoelectric member, discharging the electromechanical potential that had accumulated in the crystal during Stage 1, much more rapidly than the natural rate of decay. At the end of Stage 2, the microcontroller 336 abruptly terminates the rapid discharge before the potential energy of the crystal has reached zero. Microcontroller 336 accomplishes this by turning off control signal C3 to thereby return resistor 324 to a high resistance value.

At the beginning a Stage 3, the actuator 310 has not only some potential energy remaining, but also has some kinetic energy accumulated as a result of the mechanical motion induced in Stage 2. Thus in Stage 3, the voltage at node 312 begins an oscillating decay which is dictated by the electrical and mechanical parameters of the crystal, as well as the starting potential and kinetic energy when control signal C3 was turned off. The cycle of Stages 1–3 as shown in FIG. 4 can be repeated as desired to achieve the required level of statistical measurement stability. During Stage 3, microcontroller 336 issues sampling pulses on control signal lined C2 to the ADC 330 and memory 332, to thereby digitize the decay profile. The buffer 326 provides high impedance isolation of the DUT voltage node 312 from the sampling circuitry, and the low pass filter 328 provides Nyquist filtering for ADC 330. For DUTs having a resonant frequency on the order of 5–10 kHz, the sampling rate preferably should be at least on the order of 200 kHz in order to obtain sufficient numbers of samples in each period of oscillation.

Stage 3 is considered a period of "free oscillation" or "substantially free oscillation" because there are no substantial external influences on the piezoelectric crystal in the DUT 310. Free oscillation is desirable in Stage 3 because it simplifies analysis of the resulting signal. As a practical matter both the resistance of resistor 324 and the input resistance of buffer 326 are less than infinite, and the circuit also contains various parasitic inductances and capacitances. These influences, however, are not considered "substantial" because they do not affect the accuracy of the analyses by any significant degree. Another embodiment could also include substantial influences external to the crystal in DUT 310 during Stage 3, and these can be acceptable as long as they are accounted for in the calculations.

The discharge profile in stage 2 is controlled to achieve a compromise between several competing goals. On one hand, it is desired that the rate of discharge of the potential energy in crystal 310 during Stage 2, and the abruptness with which the accelerated discharge terminates, both be rapid enough to cause oscillations in the Stage 3 signal. It is particularly desirable that the frequency spectrum of the free oscillation profile in Stage 3 have sufficient signal-to-noise (SNR) in whatever frequency range(s) are of interest in the analysis. In particular, one embodiment utilizes the resonant frequency exhibited by the DUT as an indicator of acceptability. In such an embodiment it is desired that the rate of discharge in Stage 2 and the abruptness with which Stage 2 terminates both be rapid enough so as to produce sufficient energy in Stage 3 at frequencies at and above the known-good resonant frequency to stand out of above the noise. Preferably the discharge rate during Stage 2 should be at least twice the discharge rate that a good assembly would be expected to exhibit if left to discharge freely. On the other hand, if the rate of discharge or the abruptness of its termination are too rapid, then the mechanical stresses induced in the crystal could destroy it.

As regards the length of time that Stage 2 is allowed to continue, there are competing goals here as well. On one hand, if Stage 2 is terminated too quickly, there may be insufficient kinetic energy accumulated to achieve large enough oscillation amplitudes in Stage 3 to rise above the noise. On the other hand, if Stage 2 is allowed to continue for too long a period of time, and the DUT 310 may have too little potential energy remaining at the beginning of Stage 3 to provide a long enough period of decay to obtain sufficient numbers of samples over a sufficient number of oscillation cycles. The sampling frequency of control signal C2 can be increased to obtain more samples if the rate decay in Stage 3 is too rapid, but that remedy would not overcome the problem of obtaining data over an insufficient number of cycles of oscillation. Preferably Stage 2 should be terminated at an appropriate time before full discharge such as to produce at least 5, and even more preferably 10, usable cycles of oscillation in Stage 3, and during which measurement samples are taken.

Analysis of Stage 3 Voltage Decay Profile

As mentioned, the voltage decay profile detected in Stage 3 of the process can be is analyzed to extract various features which can be used to characterize the piezoelectric crystal in the DUT 310. These features can be compared to those of known-good devices in order to determine whether the device under test meets predetermined specifications. A wide variety of different kinds of measurements and tests can be made. Only certain examples are set forth herein, and additional features and characteristics that can be used will be apparent to persons of ordinary skill.

Figure 5A:
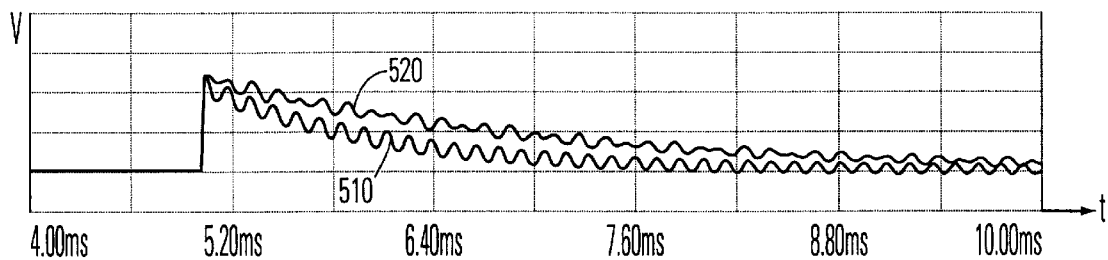
FIG. 5A is an enlarged view of two example time domain Stage 3 response signals.
Figure 5B:
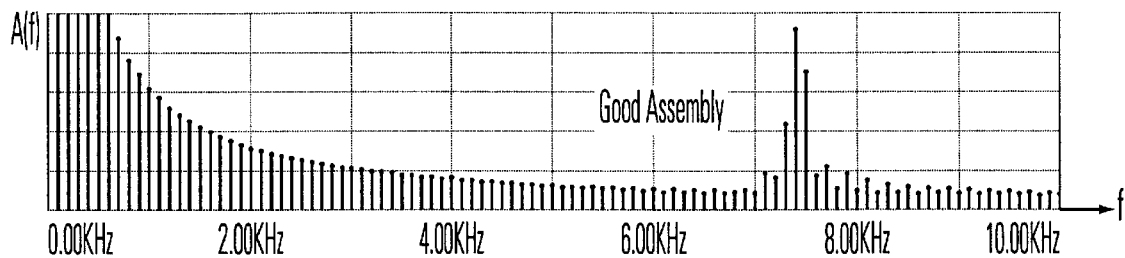
FIGS. 5B and 5C illustrate the frequency spectrums of the two signals in FIG. 5A.
Figure 5C:
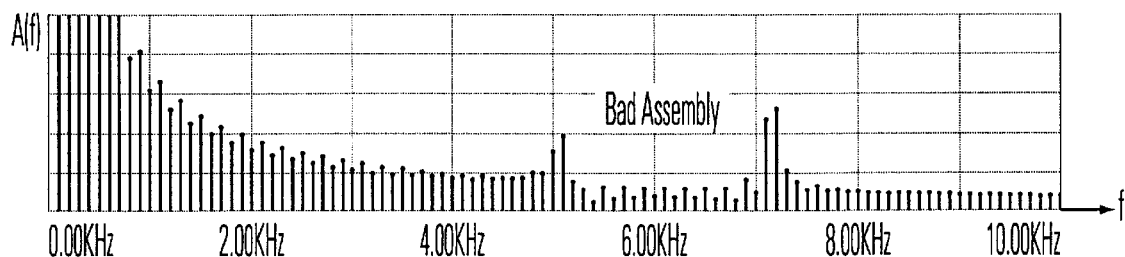

FIG. 5A illustrates simulated time domain Stage 3 decay profiles for each of two different piezoelectric actuators. Curve 510 is for a known a good assembly, and curve 520 is for a known-defective assembly. Certain differences are apparent in the time domain, and these can be extracted to determine whether the actuator corresponding to curve 520 meets predetermined specifications. As one example, the time constant with which the oscillations decrease in magnitude can be determined and used as a comparison feature. Also the time constant of the overall decay can be used as a comparison feature. In other embodiments, the sample data can be converted into the frequency domain using an FFT or DFT algorithm or device, and certain frequency domain features can be extracted. FIG. 5B illustrates a frequency domain profile corresponding to the Stage 3 time domain decay profile 510, of the known a good assembly. As can be seen, there is a peek at about 7.4 kHz, which represents the resonant frequency of the crystal. FIG. 5C illustrates the frequency spectrum corresponding to the Stage 3 time domain decay profile 520, of the known bad assembly. As can be seen, an additional low-frequency oscillation mode is exhibited at about 5.1 kHz. In addition, the main oscillation mode is at a slightly lower frequency, and reduced amplitude. All these features can be used to identify a defective DUT.

In yet other embodiments, the time domain data can be best-fit to a polynomial using well-known techniques, and the determined coefficients can be used for comparison to those of known good devices. Second or third order polynomials can be used for this purpose, for example.

In one particularly informative embodiment, the Stage 3 time domain decay profile is approximated as that of an electromechanical system of the third order, and represented by the following equation:

$$V(t) = A \cdot \cos(2\pi f t) \cdot e^{(-t/\tau)} + B \cdot e^{(-t/\tau_1)} \quad (2)$$

where

V(t) is the voltage across a piezoelectric actuator, t is time, f is the resonant frequency exhibited by the DUT (strongest resonant frequency, if more than one), $\tau$ is the time constant with which the magnitude of the oscillations decays, $\tau_1$ is the time constant of the overall exponential decay of the signal, and A and B are the amplitudes of the AC and exponential components of the signal, respectively.

The features that are extracted in this embodiment for comparison against those of known good devices are the resonant frequency f (or main resonant frequency, if more than one), and the two time constants $\tau$ and $\tau_1$. The resonant frequency f can be determined by performing a discrete Fourier transform and searching for the frequency of maximum amplitude. The value of time constant $\tau_1$ can be estimated from the ratio of the average oscillation amplitude at one point in time, to the average oscillation amplitude at a different point in time. One specific algorithm for accomplishing this is as follows:

1. Select two time points $t_1$ and $t_2$, both of which are integer multiples of 1/f.
2. Select an averaging window size w which is also an integer multiple of 1/f.
3. Calculate local mean values from the sample data around each of the time points $t_1$ and $t_2$ as follows:

$$MEAN_1 = w^{-1} \sum_k Data_{t_1 - \frac{w}{2} + k}, \quad k = 0, 1, \cdots, w-1 \quad (3)$$

$$MEAN_2 = w^{-1} \sum_k Data_{t_2 - \frac{w}{2} + k}, \quad k = 0, 1, \cdots, w-1 \quad (4)$$

The two averaging window sizes w do not have to be the same.

4. Calculate $\tau_1$ as follows:

$$\tau_1 = \frac{t_2 - t_1}{\ln\left(\frac{MEAN_1}{MEAN_2}\right)} \quad (5)$$

This estimation technique avoids the need for calibration because it depends only on the ratio of two values, rather than on their absolute values.

Similarly, the value of time constant T can be estimated by a similar ratio technique, in essence by first filtering or cancelling out the oscillations. The time constant r is then estimated from the ratio of the average voltage at one point in time, to the average voltage at a different point in time. Again, one specific algorithm for accomplishing this is as follows:

1. Separate the low frequency (LF) and high frequency (HF) signal components. The HF signal component is the component of the sampled Stage 3 signal which is near or above the oscillation frequency, and the LF signal component is the component that contains the overall exponential decay of the signal:

$$LF(t) = \frac{MEAN_1}{\exp\left(\frac{-t_1 - \frac{w}{2}}{\tau_1}\right)} \cdot \exp\left(\frac{-t}{\tau_1}\right) \quad (6)$$

$$HF(t) = V(t) - LF(t) \quad (7)$$

2. Calculate local LF mean values at both time points $t_1$ and $t_2$:

$$LFMEAN_1 = w^{-1} \cdot \sum_k Data_{t_1 - \frac{w}{2} + k} \quad (8)$$

$$LFMEAN_2 = w^{-1} \cdot \sum_k Data_{t_2 - \frac{w}{2} + k} \quad (9)$$

Again, the averaging time windows w do not have to be the same as each other or the same as those used to calculate $\tau_1$.

3. Estimate the standard deviation at both time points $t_1$ and $t_2$:

$$STD_1 = \sqrt{\frac{\sum_k HF\left(t_1 + k \cdot \Delta t - \text{int}\left(\frac{w}{2}\right)\right)^2}{w \cdot (w - 1)}} \quad (10)$$

$$STD_2 = \sqrt{\frac{\sum_k HF\left(t_2 + k \cdot \Delta t - \text{int}\left(\frac{w}{2}\right)\right)^2}{w \cdot (w - 1)}}, \quad (11)$$

where $\Delta t$ is the sampling period.

4. Calculate $\tau$ from the ratio of the standard deviations at both time points $t_1$ and $t_2$:

$$\tau = \frac{t_2 - t_1}{\ln\left(\frac{STD_1}{STD_2}\right)} \quad (12)$$

Once we have the values of f, $\tau$ and $\tau_1$ for the DUT, these values can then be compared to those of a known-good piezoelectric actuator assembly to determine whether the DUT is good or defective. This determination might, in some embodiments, involve the following sequence: First, determine whether each of the extracted parameters of the DUT are within a predetermined "good" range of the corresponding parameters of a known-good assembly. If they all are, then pass the DUT. If at least one of the extracted parameters of the DUT is outside the "good" range of the corresponding known-good parameter, but all are within a larger, predetermined "uncertain" range of their corresponding known-good parameters, then remove the DUT for furthers testing, analysis and/or inspection before finalizing a determination of whether it meets specifications. If at least one of the extracted parameters of the DUT is outside the "uncertain" range of its corresponding known-good parameter, then fail the DUT.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, the techniques described herein also can be used to test a piezoelectric actuator that is not incorporated into a larger assembly. In addition, any and all variations described, suggested or incorporated by reference in the Background section of this patent application are specifically incorporated by reference into the description herein of embodiments of the invention. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A method for testing an assembly, comprising the steps of:
   inducing a substantially steady state electromechanical potential into a piezoelectric member of said assembly;
   partially discharging said electromechanical potential through an electrical discharge path having a discharge resistance;
   abruptly increasing said discharge resistance before said electromechanical potential completely discharges; and
   taking measurements of an electrical signal produced in response to said piezoelectric member during said step of discharging.

2. A method according to claim 1, wherein said step of inducing a substantially steady state electromechanical potential comprises the step of driving a D.C. electrical potential across said piezoelectric member for a sufficiently long period of time.

3. A method according to claim 1, wherein said step of inducing a substantially steady state electromechanical potential comprises the steps of:
   activating a voltage source to output a voltage step output;
   low-pass filtering said voltage step output and driving it across said piezoelectric member; and
   after said step of activating, maintaining said voltage step output at a constant voltage for a sufficiently long period of time.

4. A method according to claim 1, wherein said step of abruptly increasing said discharge resistance comprises the step of disconnecting said discharge path.

5. A method according to claim 1, wherein said step of taking measurements comprises the step of taking measurements of said electrical signal during said step of discharging but only after said step of abruptly increasing said discharge resistance.

6. A method according to claim 1, wherein said step of taking measurements comprises the step of calculating a ratio of the average oscillation amplitude of said electrical signal at one point in time, to the average oscillation amplitude of said electrical signal at a different point in time.

7. A method according to claim 1, wherein said step of taking measurements comprises the steps of:
   filtering out oscillations in said electrical signal at at least one resonance frequency; and
   calculating a ratio of the average voltage of said filtered electrical signal at one point in time, to the average voltage of said filtered electrical signal at a different point in time.

8. A method for testing an assembly, comprising the steps of:

inducing a substantially steady state electromechanical potential into a piezoelectric member of said assembly, said piezoelectric member having a natural rate of discharge;

partially discharging said electromechanical potential more rapidly than said natural rate of discharge;

abruptly slowing the rate of discharge of said electromechanical potential to a rate substantially equal to said natural rate of discharge; and taking measurements of an electrical signal produced in response to said piezoelectric member during said step of partially discharging.

9. A method according to claim 8, wherein said step of partially discharging said electromechanical potential more rapidly than said natural rate of discharge comprises the step of partially discharging said electromechanical potential much more rapidly than said natural rate of discharge.

10. A method according to claim 8, wherein said step of partially discharging said electromechanical potential more rapidly than said natural rate of discharge comprises the step of partially discharging said electromechanical potential at least twice as rapidly as said natural rate of discharge.

11. A method according to claim 8, wherein said step of taking measurements comprises the step of detecting a resonance frequency in said electrical signal produced in response to said piezoelectric member after said step of abruptly slowing the rate of discharge.

12. A method according to claim 8, wherein said step of taking measurements comprises the step of determining an amplitude of a resonance line in said electrical signal produced in response to said piezoelectric member after said step of abruptly slowing the rate of discharge.

13. A method according to claim 8, wherein said step of taking measurements comprises the step of determining an oscillation decay time constant in said electrical signal produced in response to said piezoelectric member after said step of abruptly slowing the rate of discharge.

14. A method according to claim 8, wherein said step of taking measurements comprises the step of determining a low frequency exponential discharge time constant in said electrical signal produced in response to said piezoelectric member after said step of abruptly slowing the rate of discharge.

15. A method for testing a piezoelectric actuator, comprising the steps of:

inducing a substantially steady state electromechanical potential into said actuator; partially discharging said electromechanical potential through an electrical discharge path having a discharge resistance; and abruptly increasing said discharge resistance before said electromechanical potential completely discharges; and taking measurements of an electrical signal produced by said actuator during said step of discharging.

16. A method according to claim 15, wherein said step of inducing a substantially steady state electromechanical potential comprises the step of driving a D.C. electrical potential across said actuator for a sufficiently long period of time.

17. A method according to claim 15, wherein said step of taking measurements comprises the step of taking measurements of said electrical signal during said step of discharging but only after said step of abruptly increasing said discharge resistance.

18. A method for testing a piezoelectric actuator, comprising the steps of:

inducing a substantially steady state electromechanical potential into said actuator;

partially discharging said electromechanical potential at a rapid rate;

abruptly terminating said rapid rate of discharge at a termination time before said electromechanical potential is completely discharged, and taking measurements of an electrical signal produced by said actuator during said step of discharging, wherein said rapid rate and said termination time are such as to yield oscillations in further discharge of said electromechanical potential after said step of abruptly terminating.

19. A method for testing an assembly, comprising the steps of:

electrically inducing a substantially steady state electromechanical potential into a piezoelectric member of said assembly;

partially discharging said electromechanical potential at a rapid rate;

abruptly terminating said rapid rate of discharge at a termination time before said electromechanical potential completely discharges; and taking measurements of an electrical signal produced in response to said piezoelectric member after said step of abruptly terminating.

20. A method according to claim 19, wherein said step of electrically inducing a substantially steady state electromechanical potential comprises the step of driving a low-pass filtered D.C. step voltage across said piezoelectric member for a sufficiently long period of time.

21. A method according to claim 19, wherein said step of partially discharging comprises the steps of partially discharging said electromechanical potential through an electrical discharge path having a discharge resistance, and wherein said step of abruptly terminating said rapid rate of discharge comprises the step of abruptly increasing said discharge resistance before said electromechanical potential completely discharges.

22. A method according to claim 21, wherein said step of abruptly increasing said discharge resistance comprises the step of disconnecting said discharge path.

23. A method according to claim 19, wherein said rapid rate and said termination time are such as to yield oscillations in further discharge of said electromechanical potential after said step of abruptly terminating.

24. A method according to claim 23, further comprising the step of allowing said electromechanical potential to discharge substantially freely after said step of abruptly terminating.

25. A method according to claim 23, wherein said step of taking measurements comprises the step of detecting a resonance frequency in said electrical signal after said step of abruptly terminating.

26. A method according to claim 23, wherein said step of taking measurements comprises the step of determining an amplitude of a resonance line in said electrical signal after said step of abruptly terminating.

27. A method according to claim 23, wherein said step of taking measurements comprises the step of determining a decay time constant in said oscillations after said step of abruptly terminating.

28. A method according to claim 23, wherein said step of taking measurements comprises the step of determining a low frequency exponential discharge time constant in said electrical signal after said step of abruptly terminating.

29. A method for testing an assembly, comprising the steps of:

electrically inducing a substantially steady state electromechanical potential into a piezoelectric member of said assembly;

partially discharging said electromechanical potential at a rapid rate;

abruptly terminating said rapid rate of discharge at a termination time before said electromechanical potential completely discharges;

allowing said electromechanical potential to discharge substantially freely after said step of abruptly terminating; and taking measurements of an electrical signal produced in response to said piezoelectric member during said substantially free discharge period, wherein said rapid rate and said termination time are such as to yield oscillations in further discharge of said electromechanical potential after said step of abruptly terminating.

30. A method according to claim 29, wherein said electrical signal includes substantial frequency content at and above an expected resonant frequency of said assembly.

31. A method according to claim 29, wherein said assembly has an expected resonant frequency of oscillation, and wherein said step of taking measurements comprises the step of sampling said electrical signal for at least 5 periods of said expected resonant frequency after said step of abruptly terminating.

32. A method according to claim 29, wherein said assembly has an expected resonant frequency of oscillation, and wherein said step of taking measurements comprises the step of sampling said electrical signal for at least 10 periods of said expected resonant frequency after said step of abruptly terminating.

33. A method according to claim 29, wherein said rapid rate of discharge is at least twice the expected natural rate of discharge of said assembly.

34. A method for testing a disk head arm assembly, comprising the steps of:

inducing a substantially steady state electromechanical potential into a piezoelectric member of said assembly, partially discharging said electromechanical potential at a rapid rate;

abruptly terminating said rapid rate of discharge at a termination time before the voltage across said piezoelectric member reaches zero; and taking measurements of an electrical signal produced in response to said piezoelectric member after said step of abruptly terminating.

35. A method according to claim 34, wherein said step of electrically inducing a substantially steady state electromechanical potential comprises the step of driving a low-pass filtered D.C. step voltage across said piezoelectric member for a sufficiently long period of time.

36. A method according to claim 34, wherein said step of partially discharging comprises the steps of partially discharging said electromechanical potential through an electrical discharge path having a discharge resistance, and wherein said step of abruptly terminating said rapid rate of discharge comprises the step of abruptly increasing said discharge resistance before the voltage across said piezoelectric member reaches zero.

37. A method according to claim 36, wherein said step of abruptly increasing said discharge resistance comprises the step of disconnecting said discharge path.

38. A method according to claim 34, wherein said rapid rate and termination time are such as to yield oscillations in further discharge of said electromechanical potential after said step of abruptly terminating.

39. A method according to claim 38, further comprising the step of allowing said electromechanical potential to discharge substantially freely after said step of abruptly terminating.

40. A method according to claim 38, wherein said step of taking measurements comprises the step of detecting a resonance frequency in said electrical signal after said step of abruptly terminating.

41. A method according to claim 38, wherein said step of taking measurements comprises the step of determining an amplitude of a resonance line in said electrical signal after said step of abruptly terminating.

42. A method according to claim 38, wherein said step of taking measurements comprises the step of determining a decay time constant in said oscillations after said step of abruptly terminating.

43. A method according to claim 38, wherein said step of taking measurements comprises the step of determining a low frequency exponential discharge time constant in said electrical signal after said step of abruptly terminating.

44. A method according to claim 34, wherein said rapid rate and said termination time are such as to yield, after said step of abruptly terminating, a waveform that includes the sum of at least (1) an oscillating component having an amplitude that decays according to a first time constant ($\tau$), and (2) a non-oscillating component decaying according to a second time constant ($\tau_1$).

45. A method according to claim 44, wherein said step of taking measurements comprises the step of determining a value for said second time constant ($\tau_1$).

46. A method for testing a disk head arm assembly, comprising the steps of:

electrically inducing a substantially steady state electromechanical potential into a piezoelectric actuator member of said assembly, said electromechanical potential causing displacement of a head arm of said assembly;

partially discharging said electromechanical potential at a rapid rate;

abruptly terminating said rapid rate of discharge at a termination time before the voltage across said piezoelectric member reaches zero;

allowing said electromechanical potential to discharge substantially freely after said step of abruptly terminating, said rapid rate and said termination time being such as to yield, after said step of abruptly terminating, a waveform that includes the sum of at least (1) an oscillating component having an amplitude that decays according to a first time constant ($\tau$), and (2) a non-oscillating component decaying according to a second time constant ($\tau_1$); and taking measurements of an electrical signal produced in response to said piezoelectric member during said substantially free discharge period.

47. A method according to claim 46, wherein said electrical signal includes substantial frequency content at and above an expected resonant frequency of said assembly.

48. A method according to claim 46, wherein said assembly has an expected resonant frequency of oscillation, and wherein said step of taking measurements comprises the step of sampling said electrical signal for at least 5 periods of said expected resonant frequency after said step of abruptly terminating.

49. A method according to claim 46, wherein said assembly has an expected resonant frequency of oscillation, and wherein said step of taking measurements comprises the step of sampling said electrical signal for at least 10 periods of said expected resonant frequency after said step of abruptly terminating.

50. A method according to claim 46, wherein said rapid rate of discharge is at least twice the expected natural rate of discharge of said assembly.

51. A method according to claim 46, wherein said step of taking measurements comprises the step of determining a value for said second time constant ($\tau_1$).

52. A method according to claim 51, wherein said step of taking measurements comprises the step of detecting a resonance frequency in said oscillating component electrical signal after said step of abruptly terminating.

53. A method according to claim 52, wherein said step of taking measurements further comprises the step of determining an amplitude of a resonance line in said oscillating component of said electrical signal after said step of abruptly terminating.

54. A method according to claim 53, wherein said step of taking measurements further comprises the step of determining a value for said first time constant ($\tau$).

55. Apparatus for testing an assembly including a piezoelectric member, comprising:
   a voltage source that, when controlled to do so, asserts a substantially steady state voltage across said piezoelectric member;
   a controllable resistor in parallel with said a circuit that includes said piezoelectric member as a series component; and
   a programmable digital unit that is programmed to be able to:
      in a first stage controls said voltage source to assert said substantially steady state voltage across said piezoelectric member,
      in a second stage subsequent to said first stage controls said voltage source to stop asserting a voltage across said piezoelectric member, and controls said controllable resistor to exhibit a non-infinite discharge resistance across said piezoelectric member, and
      in a third stage subsequent to said second stage controls said voltage source to not assert a voltage across said piezoelectric member, and controls said controllable resistor to exhibit a high resistance across said piezoelectric member higher than said discharge resistance; and
   means for taking measurements of an electrical signal produced in response to said piezoelectric member during said third stage.

56. Apparatus for testing an assembly including a piezoelectric member, comprising:
   a voltage source that, when controlled to do so, asserts a substantially steady state voltage across said piezoelectric member;
   a controllable resistor in parallel with said a circuit that includes said piezoelectric member as a series component; and
   a control unit that, at least in a mode of operation:
      in a first stage controls said voltage source to assert said substantially steady state voltage across said piezoelectric member,
      in a second stage subsequent to said first stage controls said voltage source to stop asserting a voltage across said piezoelectric member, and controls said controllable resistor to exhibit a non-infinite discharge resistance across said piezoelectric member, and
      in a third stage subsequent to said second stage controls said voltage source to not assert a voltage across said piezoelectric member, and controls said controllable resistor to increase the resistance across said piezoelectric member to a resistance higher than said discharge resistance, before the potential in said piezoelectric member discharges completely; and
   means for taking measurements of an electrical signal produced in response to said piezoelectric member during said third stage.

* * * * *